(12) United States Patent
Nguyen et al.

(10) Patent No.: US 12,218,201 B2
(45) Date of Patent: Feb. 4, 2025

(54) DEVICE ARCHITECTURES WITH TENSILE AND COMPRESSIVE STRAINED SUBSTRATES

(71) Applicants: Soitec, Bernin (FR); National University of Singapore, Singapore (SG)

(72) Inventors: Bich-Yen Nguyen, Austin, TX (US); Christophe Maleville, Lumbin (FR); Walter Schwarzenbach, Saint Nazaire Les Eymes (FR); Gong Xiao, Singapore (SG); Aaron Thean, Singapore (SG); Chen Sun, Singapore (SG); Haiwen Xu, Singapore (SG)

(73) Assignees: National University of Singapore, Singapore (SG); Soitec, Bernin (FR)

( * ) Notice: Subject to any disclaimer, the term of this patent is extended or adjusted under 35 U.S.C. 154(b) by 0 days.

(21) Appl. No.: 17/347,417

(22) Filed: Jun. 14, 2021

(65) Prior Publication Data
US 2022/0399441 A1    Dec. 15, 2022

(51) Int. Cl.
*H01L 29/10* (2006.01)
*H01L 21/02* (2006.01)
(Continued)

(52) U.S. Cl.
CPC .... *H01L 29/1037* (2013.01); *H01L 21/02164* (2013.01); *H01L 21/02236* (2013.01);
(Continued)

(58) Field of Classification Search
CPC ........... H01L 29/1037; H01L 21/02164; H01L 21/02236; H01L 21/02532; H01L 21/02667; H01L 21/26526; H01L 21/845; H01L 27/1211; H01L 29/1054; H01L 29/161; H01L 29/7838
See application file for complete search history.

(56) References Cited

U.S. PATENT DOCUMENTS

| 8,486,771 | B2 | 7/2013 | Letertre et al. |
| 8,492,244 | B2 | 7/2013 | Guenard et al. |

(Continued)

OTHER PUBLICATIONS

Sun et al., Enabling UTB Strained SOI Platform for Co-integation of Si Logic and RF: Implant-Induced Strain Relaxation and Comb-like Device Architecture, IEEE Symposium on VLSI Technology and Circuits, (Jun. 2020), 4 pages.

*Primary Examiner* — Julia Slutsker
(74) *Attorney, Agent, or Firm* — TraskBritt

(57) ABSTRACT

A semiconductor structure, including: a base substrate; an insulating layer on the base substrate, the insulating layer having a thickness between about 5 nm and about 100 nm; and an active layer comprising at least two pluralities of different volumes of semiconductor material comprising silicon, germanium, and/or silicon germanium, the active layer disposed over the insulating layer, the at least two pluralities of different volumes of semiconductor material comprising: a first plurality of volumes of semiconductor material having a tensile strain of at least about 0.6%; and a second plurality of volumes of semiconductor material having a compressive strain of at least about −0.6%. Also described is a method of preparing a semiconductor structure and a segmented strained silicon-on-insulator device.

13 Claims, 11 Drawing Sheets

(51) Int. Cl.
  *H01L 21/265* (2006.01)
  *H01L 21/84* (2006.01)
  *H01L 27/10* (2006.01)
  *H01L 27/12* (2006.01)
  *H01L 29/161* (2006.01)
  *H01L 29/78* (2006.01)

(52) U.S. Cl.
  CPC .. *H01L 21/02532* (2013.01); *H01L 21/02667* (2013.01); *H01L 21/26526* (2013.01); *H01L 21/845* (2013.01); *H01L 27/10* (2013.01); *H01L 27/1211* (2013.01); *H01L 29/1054* (2013.01); *H01L 29/161* (2013.01); *H01L 29/7838* (2013.01)

(56) References Cited

U.S. PATENT DOCUMENTS

| | | | |
|---|---|---|---|
| 8,574,968 B2 | 11/2013 | Arena et al. | |
| 8,652,887 B2 | 2/2014 | Nguyen et al. | |
| 9,093,271 B2 | 7/2015 | Schenk et al. | |
| 9,293,448 B2 | 3/2016 | Nguyen et al. | |
| 9,368,344 B2 | 6/2016 | Arena | |
| 10,177,163 B1* | 1/2019 | Chan | H01L 29/0649 |
| 2004/0099903 A1* | 5/2004 | Yeo | H01L 29/785 257/317 |
| 2007/0123010 A1* | 5/2007 | Hoentschel | H01L 29/7843 257/E21.345 |
| 2007/0181977 A1* | 8/2007 | Lochtefeld | H01L 29/7834 257/E29.267 |
| 2014/0284769 A1* | 9/2014 | Halimaoui | H01L 21/0245 438/479 |
| 2014/0306320 A1 | 10/2014 | Arena | |
| 2015/0303218 A1* | 10/2015 | Loubet | H01L 21/30604 257/77 |
| 2016/0181365 A1* | 6/2016 | Bolotnikov | H01L 29/1095 257/329 |
| 2016/0372379 A1* | 12/2016 | Cheng | H01L 21/02422 |
| 2020/0203530 A1* | 6/2020 | Utess | H01L 21/84 |

* cited by examiner

US 12,218,201 B2

DEVICE ARCHITECTURES WITH TENSILE AND COMPRESSIVE STRAINED SUBSTRATES

TECHNICAL FIELD

This disclosure relates to strained silicon-on-insulator (SSOI) devices. Specifically, this disclosure relates to SSOI devices having both compressive-strained and tensile-strained regions.

BACKGROUND

Fully depleted (FD) ultra-thin box and body (UTBB) architecture has become increasingly attractive as device sizes continued to shrink. Such an architecture includes a substrate, for example, a silicon substrate which supports a thin layer of insulator. The thin layer of insulator supports a thin layer of silicon. The use of a thin layer of silicon enables the use of fully depleted silicon, which is to say, undoped with charge carriers.

Such architectures have advantages compared with partially depleted designs. For example, current leakage and power consumption are reduced in FD silicon-on-insulator designs. There is no floating body effect so it may be easier to design and to control short-channel effects (SCEs). However, the very thin layers of silicon and insulator, less than 5 nm, can be challenging to produce and control.

Semiconductor devices may include multiple types of field effect transistors (FETs). For example, a semiconductor device may include both p-type FETs (pFETs) and n-type FETs (nFETs). However, such designs have generally been unsatisfactory due to the different optimization conditions for pFETs and nFETs. Accordingly, a substrate that provided good performance for one type of FET did not provide good performance for a second type of FET. For example, nFETs are optimized on a tensile strained substrate. In contrast, pFETs are optimized on a compressively strained substrate. Previous attempts to generate both compressive and tensile strained areas on a shared substrate have been unsatisfactory or faced a compromise. Specifically, the optimization for one type of FET has hindered optimization for a second type of FET. For example, efforts to optimize the tensile strain of the substrate for nFETs has impeded in the development of compressive strain of the substrate for pFETs.

BRIEF SUMMARY

A semiconductor structure, including: a base substrate; an insulating layer on the base substrate, the insulating layer having a thickness between about 5 nm and about 100 nm; and an active layer comprising at least two pluralities of different volumes of semiconductor material comprising silicon, germanium, and/or silicon germanium, the active layer disposed over the insulating layer, the at least two pluralities of different volumes of semiconductor material including: a first plurality of volumes of semiconductor material having a tensile strain of at least about 0.6%; and a second plurality of volumes of semiconductor material having a compressive strain of at least about −0.6%.

A method of preparing a semiconductor structure, including: forming a tensile-strained semiconductor-on-insulator structure having a substrate, an insulating layer on the substrate having a thickness of about 5 nm to about 100 nm, and an active layer comprising a silicon material, the silicon material having a tensile strain; implanting at least a portion of the active layer with ions to render at least a portion of the active layer amorphous and reduce the tensile strain in the at least a portion of the active layer; thermally annealing the implanted at least a portion of the active layer and recrystallizing the at least a portion of the active layer previously rendered amorphous; and performing a germanium condensation process on the recrystallized at least a portion of the active layer to form a SiGe material having a compressive strain.

Also described is a semiconductor device, including: a semiconductor-on-insulator substrate including a base substrate, a buried insulator layer, and an active layer comprising a fully depleted semiconductor material; and a plurality of transistors in a common plane, each transistor of the plurality of transistors comprising a channel region in a volume of the fully depleted semiconductor material of the active layer of the semiconductor-on-insulator substrate; wherein the plurality of transistors includes: nFETs having tensile strained channel regions; and pFETs having compressive strained channel regions.

BRIEF DESCRIPTION OF THE DRAWINGS

While the specification concludes with claims particularly pointing out and distinctly claiming what are regarded as embodiments of the disclosure, various features and advantages of this disclosure may be more readily ascertained from the following description of example embodiments provided with reference to the accompanying drawings, in which:

DETAILED DESCRIPTION

Figure 1A:
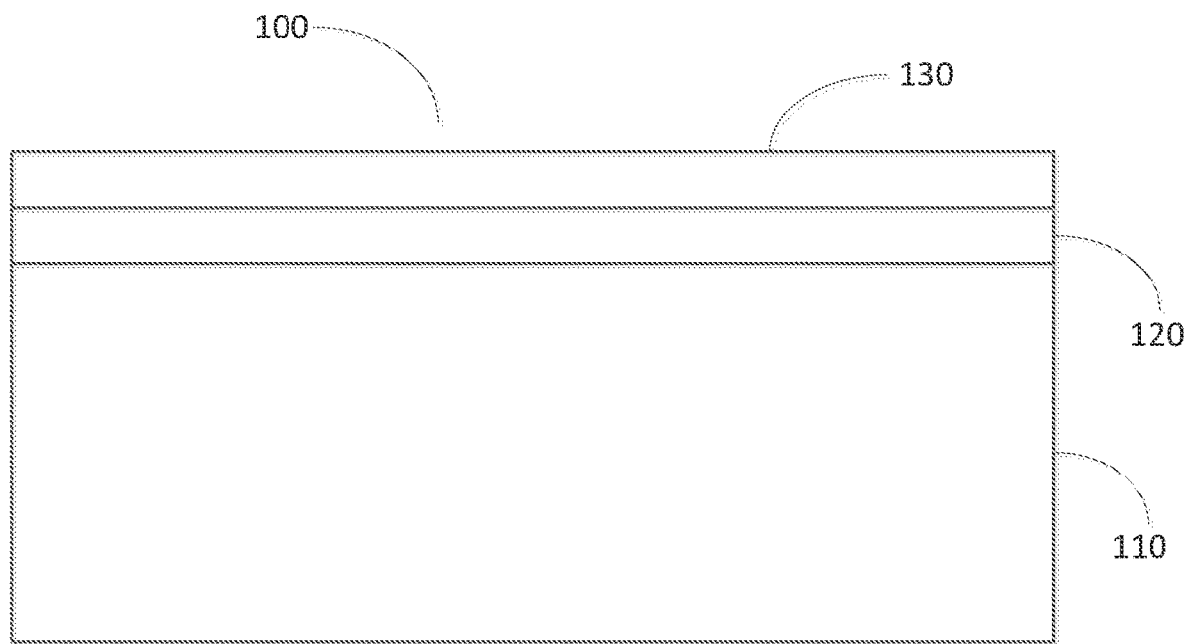
FIGS. 1A-1E depicts a process for forming an example embodiment of a semiconductor structure consistent with this disclosure.

The article, "Enabling UTB Strained SOI Platform for Co-integation of Si Logic and RF: Implant-Induced Strain Relaxation and Comb-like Device Architecture" by Sun et al., is incorporated by reference in its entirety.

Herein is disclosed an improved method of manufacturing semiconductor devices having both pFETs and nFETs on a common substrate when used with fully depleted or partially depleted designs. A silicon-on-insulator substrate may be prepared with tensile strain of about 0.8-1.2%. The portions to be modified for pFETs are exposed to ion implantation to render amorphous those portions. This reduces the tensile strain in the affected regions to about 40-60% of the original tensile strain level. The regions are then recrystallized with a short anneal of about 160-200 seconds at temperatures up to about 600-650° C. or during the pre-selective SiGe epitaxial growth at 600-650° C. This short anneal has been found to not change the strain of the substrate without implant. The implanted regions are then used to grow selective silicon-germanium layer with defined (or designed) Ge content and film thickness, then follow with oxidation at temperature ranging from 850-1000° C. to form silicon diode on the top and the silicon germanium in the bottom with a strain of about −0.8 to about −2.0% compressive. These regions are thus suitable for use in pFETs while the other regions of the wafer are suitable for nFETs to boost performance of both devices. These processes are discussed in more detail below.

The following description provides specific details, such as material compositions and processing conditions (e.g., temperatures, pressures, flow rates, etc.) in order to provide a thorough description of embodiments of the disclosure. However, a person of ordinary skill in the art will understand that the embodiments of the disclosure may be practiced without necessarily employing these specific details. Indeed, the embodiments of the disclosure may be practiced in conjunction with conventional systems and methods employed in the industry. In addition, only those process components and acts necessary to understand the embodiments of the disclosure are described in detail below. A person of ordinary skill in the art will understand that some process components (e.g., line filters, valves, temperature detectors, flow detectors, pressure detectors, and the like) are inherently disclosed herein and that adding various conventional process components and acts would be in accord with the disclosure.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figure. Unless otherwise specified, the spatially relative terms are intended to encompass different orientations of the materials in addition to the orientation depicted in the figure. For example, if materials in the figure are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, "and/or" includes any and all combinations of one or more of the associated listed items.

As used herein, the term "substantially" in reference to a given parameter, property, or condition means and includes to a degree that one skilled in the art would understand that the given parameter, property, or condition is met with a small degree of variance, such as within acceptable manufacturing tolerances. For example, a parameter that is substantially met may be at least about 90% met, at least about 95% met, or even at least about 99% met.

As used herein, the term "substantially all" means and includes greater than about 95%, such as greater than about 99%.

As used herein, the term "about" in reference to a numerical value for a particular parameter is inclusive of the numerical value and a degree of variance from the numerical value that one of ordinary skill in the art would understand is within acceptable tolerances for the particular parameter. For example, "about" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, the terms "comprising," "including," "containing," "characterized by," and grammatical equivalents thereof are inclusive or open-ended terms that do not exclude additional, unrecited elements or method acts, but also include the more restrictive terms "consisting of" and "consisting essentially of" and grammatical equivalents thereof.

As used herein, the term "may" with respect to a material, structure, feature or method act indicates that such is contemplated for use in implementation of an embodiment of the disclosure and such term is used in preference to the more restrictive term "is" so as to avoid any implication that other, compatible materials, structures, features and methods usable in combination therewith should or must be excluded.

The illustrations presented herein are not meant to be actual views of any particular substrate, or related method, but are merely idealized representations, which are employed to describe example embodiments of the present disclosure. The figures are not necessarily drawn to scale. Additionally, elements common between figures may retain the same numerical designation.

FIG. 1A depicts a semiconductor structure 100 including a substrate 110 with an insulator layer 120 supporting a tensile-strained silicon layer 130. The tensile-strained silicon layer is a silicon-on-insulator (SOI) semiconductor. The substrate 110 is initially prepared according to conventional techniques to prepare strained silicon-on-insulator devices. This provides a silicon layer 130 having a tensile strain of, for example, about 0.8%.

Figure 1B:
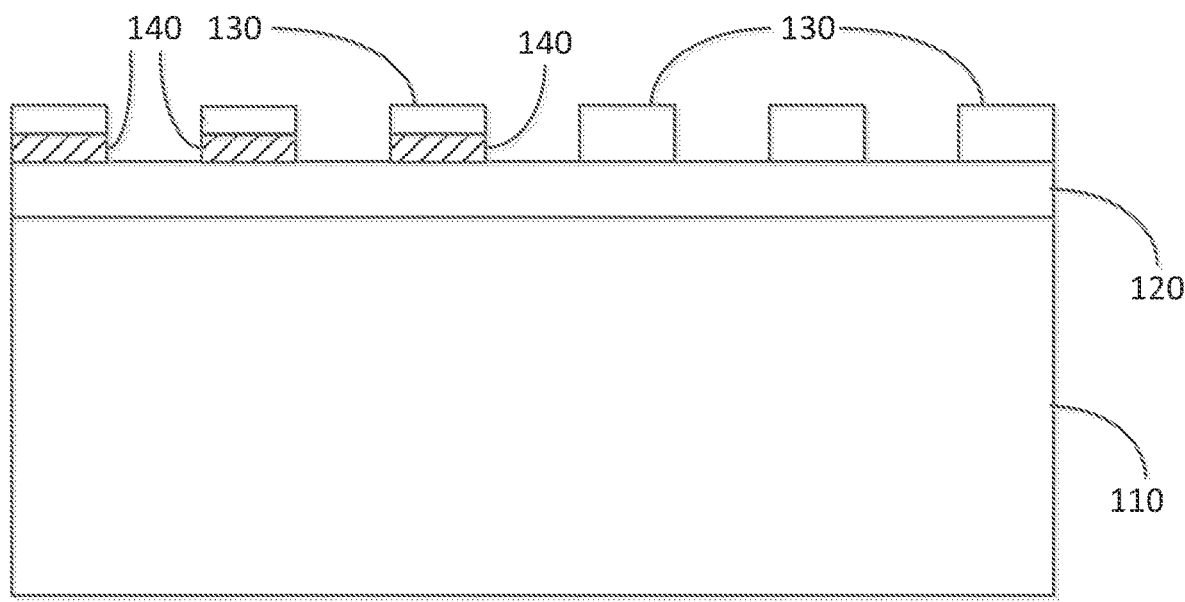

FIG. 1B depicts the semiconductor structure 100 after patterning and ion implantation. The portion of the tensile-strained silicon layer 140 has been converted to an amorphous silicon 140. The amorphous silicon 140 has tensile strain of very low level (e.g., 0-0.2% vs. 0.8%) of the tensile strain of the unexposed portion of the tensile strained silicon layer 130. The amorphous silicon 140 is on the insulator layer 120. The insulator layer is on the substrate 110.

A portion of the strained silicon-on-insulator surface is subjected to selective ion implantation at $1 \times 10^{14}$ to $4 \times 10^{14}$ ions/cm$^2$. The ions may have an energy of about 10 keV to about 16 keV. In an example, the ions had an energy of about 12 keV. In some examples, the ions where argon. In some examples, the ions were also simulated using kinetic Monte Carlo (KMC) techniques. That simulation showed an increase in amorphization of the surface between $1.5 \times 10^{14}$ and $2 \times 10^{14}$ ions/cm$^2$. This was consistent with Raman spectroscopy studies which showed significant strain relaxation for a dose of $1 \times 10^{14}$ ions/cm$^2$. The selectivity may be provided by placing a mask or cap on a portion of the substrate to shield the portion of the substrate from the ion implantation.

Measured strain of the strain silicon layer that received the amorphization implantation was reduced from about 0.8% tensile strain down to about 0.4% tensile strain. This reduction is propagated through the process to produce the high compressive strain with lower Ge content on the SSOI substrate. The result is that compressive strains of about −0.6% or higher were obtained. In some examples, the strain was about −2.0% compressive with higher Ge content in the SiGe layer after Ge condensation. The higher compressive strain silicon germanium improved performance in the pFETs formed on that compressive strained regions.

The wafer was subjected to a short anneal to recrystallize the amorphous regions. Short annealing has been found to recrystallize the amorphous or implanted layer without impacting the strain in the un-implanted regions. In some examples, the annealing cycle was between about 30 seconds to about 5 minutes. The annealing cycle may be about 60 seconds. The temperature of the annealing cycle may be between about 600° C. and about 1100° C. or even could use the short laser anneal. In one example, the annealing cycle is performed at about 1100° C. for about 60 seconds. In another example, the annealing cycle is performed at about 630° C. for about 190 seconds.

Figure 1C:
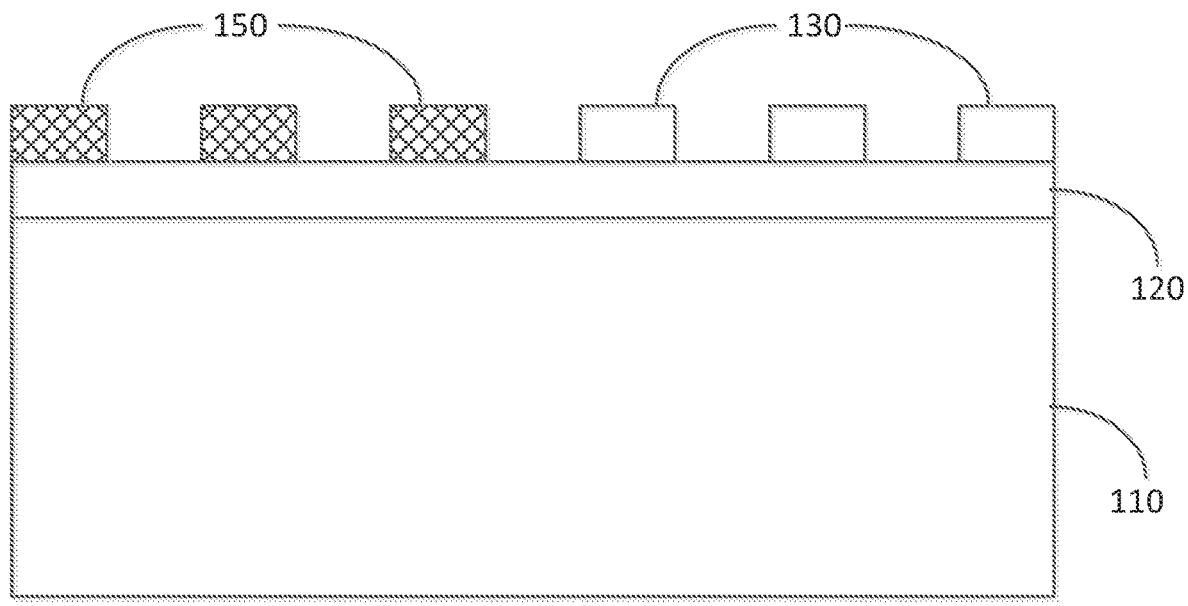

FIG. 1C depicts the semiconductor structure 100 after annealing. The amorphous silicon 140 has been converted to recrystallized silicon 150. The strained silicon layer 130 is unchanged. The recrystallized silicon 150 and the strained silicon layer 130 rest on the insulator layer 120. The insulator layer 120 rests on the substrate 110.

Figure 1D:
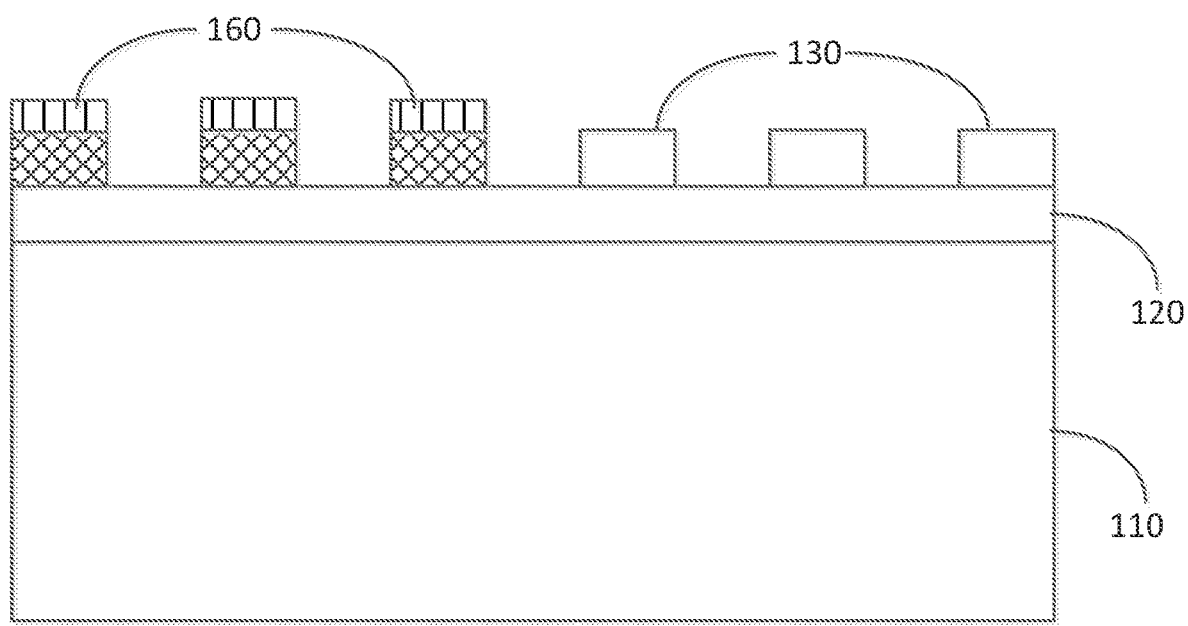

In FIG. 1D, the recrystallized silicon 150 has the silicon germanium material 160 applied to an upper surface of the recrystallized silicon 150. The silicon germanium material 160 provides a compressive strain to the respective surface where the silicon germanium material 160 is applied. In an example, the silicon germanium material 160 has a compressive stress greater than about −0.6%. For example, the silicon germanium material 160 may have a compressive stress of about −0.8%. The silicon layer 130 with the tensile stress has a tensile stress greater than about 0.6%, for example, about 0.8%. The structures thus are prepared to provide a compressive stress for pFET devices and tensile stress for nFET devices on different portions of a shared substrate 110.

The wafer is then subjected to local condensation of the $Si_{0.8}Ge_{0.2}$ area on the wafer to form a compressively strain silicon germanium with Ge content higher than 20% or the original Ge content of the selective SiGe film before condensation. The mixture of germanium and silicon produces a matrix with compressive stress. The compressive stress is applied to the recrystallized areas of reduced tensile stress from the ion implantation. The result is a compressive strain greater than about −0.6% with lower Ge content than those without implant. For example, the compressive strain may be about −0.8% with 25% Ge content in SiGe layer with partial amorphization implant. In contrast, applying the same silicon germanium and condensation processes to the unimplanted regions does not produce this level of compressive stress. For example, applying same germanium condensation process to the unimplanted regions may produce a level of compressive stress below about −0.6% compressive strain or Ge content should be higher (35-40%) to product the 0.8% compressive strain on the SSOI substrate. The implantation to reduce tensile stress and recrystallization allow the formation of compressive regions with higher compressive stress. In an example, these processes allow the formation of regions of the wafer with greater than about −0.6% compressive strain while retaining regions of greater than about 0.6% tensile strain.

In an example, the silicon germanium material 160 may be a selective SiA or SiAb epitaxy film. The silicon may then be oxidized to form $SiO_2$. In some examples, A or Ab may be injected as part of previous figures, for example, as part of the recrystallized silicon 150.

Figure 1E:
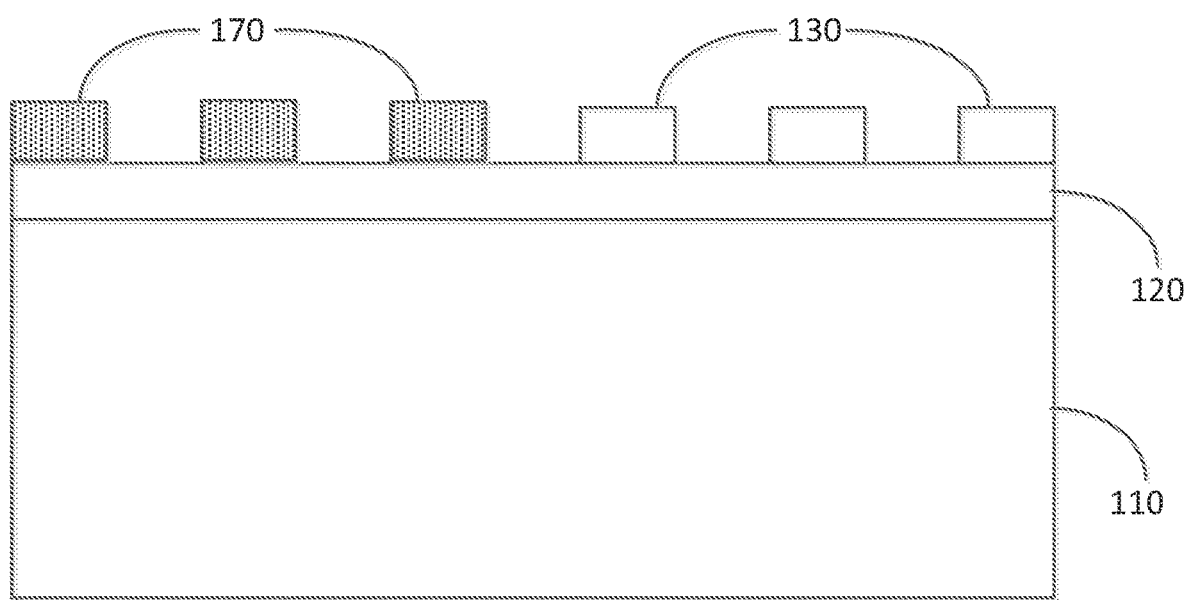

FIG. 1E shows the formed silicon germanium regions 170 which have compressive stress. The silicon germanium regions 170 may have from about −0.8% to about −2.0% compressive strain.

The result of these processes is a wafer with compressive regions containing SiGe which may be populated with pFETs and tensile regions which may be populated with nFETs. The availability of both compressive and tensile stressed regions on the same substrate provides design flexibility, scalability and performance boost-ability without or with much less device leakage trade-off, which are not available in previous SSOI designs. The higher levels of both tensile stress and compressive stress allow for higher performance compared with what was previously known in the art. For example, the prior art does not disclose a FD SSOI wafer having both tensile regions having greater than about 0.6% tensile strain and compressive regions having greater than about −0.6% compressive strain with lower Ge content-SiGe channel for lower leakage with a fully depleted strained silicon-on-insulator design.

It has been found that a fully depleted (FD) silicon-on-insulator (SOI) approach offers an easier and more cost-effective integration of both n-type and p-type devices compared with partially depleted devices. Silicon-on-insulator performance can be further enhanced by introducing strain into the thin (e.g., 15 nanometers) silicon film to form strained silicon-on-insulator (SSOI) devices. Strain increases carrier mobility, giving higher transconductance ($g_m$) and hence higher cutoff frequency ($F_t$) and maximum frequency ($F_{max}$). It has also been shown that a box thickness of just 10-15 nm is sufficient for stress memorization and sufficient body bias, and that the strain in the substrate are retained after the local condensation process at up to 1000° C. for 5 min. Herein is described the use of ultra-thin-body-and-box (UTBB) FD-SSOI to realize both tensile strained nFETs and compressive strained pFETs on a single common platform for both logic and RF circuits. The segmented SSOI can also be a potential RF performance booster for very short-channel SOI devices.

The described approach may use a fully depleted strained silicon-on-insulator (FD-SSOI) structures. The described approach may be applied with partially depleted strained silicon-on-insulator (PD-SSOI) structures. The structures may be ultra-thin-body-and-box (UTBB) devices. The use of a box thickness of about 10 to about 15 nm may be sufficient for the described devices to preserve the tensile strain in the unimplanted regions while allowing for relaxation of the ion implanted regions. Similarly, the semiconductor comb may have a thickness of between about 5 nm and about 50 nm. The semiconductor comb may be relaxed and recrystallized by the ion implantation and subsequent thermal anneal. In other examples, the semiconductor comb is not subject to the ion implantation and preserves its tensile strain through the thermal anneal and subsequent processing. For partially depleted designs, the semiconductor region may be thicker, for example, about 30 nm to about 100 nm in thickness. The insulating layer may similarly be thicker, for example, between about 50 nm to about 100 nm in thickness.

As the tensile strain in SSOI is beneficial for nFETs but detrimental for pFETs, the tensile strain has to be converted to compressive strain in the pFETs regions. Relaxation of tensile strain in FD-SSOI by ion implantation allows substantial compressive strain to be introduced in the pFETs regions by Ge condensation to form SiGe. Corresponding Kinetic Monte Carlo (KMC) simulations show varying degrees of amorphization, which can be achieved in the Si film by ion implantation. After annealing, full recrystallization of the Si film was obtained. Raman spectra were obtained at the various stages for the sample implanted at an energy of 12 keV and with a dose of $1.0 \times 10^{14}$ ions per $cm^2$. Significant relaxation of the tensile strain in the Si film occurred after ion implantation. The strain in the Si film decreased by about half after implantation, and remained relatively unchanged after $Al_2O_3$ or the like cap layer removal. The strain then stayed about the same or recovered very slightly after annealing, thus preserving the implantation-induced strain relaxation in the recrystallized film. Annealing at up to 1100° C. for 60 s was observed to cause minimal relaxation of the strain. Therefore, the tensile strain in Si film can be retained after Ge condensation at a high temperature. This tolerance to relatively high temperatures for short periods of time, in turn, allows the formation of both high tensile strain regions and high compressive strain regions on a single common platform.

Experimental measured maximum $g_m$ of SSOI nFETs with shorter channel lengths (e.g., effective gate length of under 100 nanometers) was enhanced by 30% to 50% over SOI, and almost 70% improvement was achieved for the long channel devices (e.g., effective gate length of 1000 nm). The $g_m$ was derived at $V_D$ of 1 V. The experimentally measured nFETs had a tensile strain of 0.8%.

The on-resistance ($R_{on}$) was reduced on the SiGe pFETs after tensile strain relaxation and Ge condensation compared with unrelaxed SiGe pFETs. $R_{on}$ was reduced by up to 25% for narrow width devices (e.g., transistor widths of 150 nm), where the SiGe compressive strain was enhanced and became purely longitudinal. The gate width was 1000 nanometers. The $R_{on}$ reduction decreased with increasing transistor width, dropping below 10% with a transistor width of 500 nanometers or greater.

The benefits of strained substrate for nFETs and pFETs were shown in simulated results of improvement in peak $g_m$. For example, going from 0% strain to 0.8% tensile strain increased the maximum $g_m$ for nFETs from 1.6 mS/μm to just over 2.0 mS/μm. Similarly, for the $Si_{0.8}Ge_{0.2}$ substrate supporting pFETs, going from 0% compressive strain to −0.8% compressive strain increased the maximum $g_m$ for nFETs from 1.4 mS/μm to just over 1.7 mS/μm. Estimates where calculated at a $V_D$ of 0.75 V.

Improvement was also seen in current for advanced FinFETs. For a $V_D$ of 0.05 V and a $V_G-V_T$ of 0.5 V, the nFETs had an improvement of 45% when the strain was 0.8% tensile compared with 0% strain. Similarly, the pFETs had an improvement of 55% for −0.8% compressive strain compared with 0% strain. These values were lower, 25% and 30% respectively, but still notable improvements when $V_D$ was 0.75 V.

Large improvements in both maximum $g_m$ and $I_{on}$ were derived from strain and a high compressive strain of −0.8% boosts the saturation drain current $I_{D,sat}$ ($V_D$=−0.75 V) of the SiGe pFETs by about 29%, almost double the enhancement of about 17% provided by a compressive strain of −0.5%. This highlights the importance of first relaxing the tensile strain of the SSOI wafer in the pFETs regions, so that a high compressive strain (e.g., strain of −0.8% compressive) can be achieved for the SiGe pFETs. Cut-off frequencies extracted from RF simulations for strained and unstrained Si nFETs and $Si_{0.8}Ge_{0.2}$ pFETs provided addition evidence of benefits of strained structures.

For pFETs, the use of −0.8% compressive strain increased the $F_{max}$ from about 220 GHz to about 275 GHz. Similarly, for nFETs, the use of 0.8% tensile strain increased the $F_{max}$ from about 275 GHz to about 330 GHz. For pFETs, the use of −0.8 compressive strain increased the $F_t$ from about 175 GHz to about 230 GHz. Similarly, for nFETs, the use of 0.8% tensile strain increased the $F_t$ from about 225 GHz to about 300 GHz. These assessments were made with a $V_D$ of 0.75 V.

The use of strain also improved the $F_t$ and $F_{max}$. The tensile strain of 0.8% produced an improvement of about 30% in $F_t$ and about 20% in $F_{max}$. The benefits were slightly greater for the compressive strain of −0.8% which produced an improvement of about 32% in $F_t$ and about 21% in $F_{max}$. These improvements were at $V_D$ of 0.75 V. $F_t$ and $F_{max}$ benefit greatly from strain across the entire range of $V_G$.

For the comb-like strained SOI device, the thickness of the comb ($T_{comb}$) between the fins was found to be important for performance. Short channel effects were noted but these could be controlled by adding reverse back bias (RBB), for example, of about 1 V. With a fin to fin spacing of 10 nanometers, the peak $g_m$ was notably increased with the use of 0.8% strained substrate. For example, with a comb thickness of 0 nm, the use of strain increased the maximum $g_m$ from 1.23 to 1.58 mS/μm. With a comb thickness of 1 nm, the use of strain increased maximum $g_m$ from 1.25 to 1.62 mS/μm. For a comb thickness of 3 nm, the use of strain increased maximum $g_m$ from 1.41 to 1.77 mS/μm. For a comb thickness of 5 nm, the use of strain increased maximum $g_m$ from 1.48 to 1.82 mS/μm.

The impact of fin to fin spacing was limited with small effects on drain-induced barrier lowering (DIBL) and maximum $g_m$. Fin spacing was examined at 7, 10, and 15 nanometer spacing. In contrast, the impact of 1 V reverse back bias producing a lower DIBL.

Improvements of 22% and 36% for maximum $F_t$ and $F_{max}$ with $T_{comb}$ up to 5 nm for tensile strained Si nFETs. The $F_t$ and $F_{max}$ curves are shifted towards lower $V_G$ magnitude, enabling reduced power consumption at the same high performance and providing better linearity. Even better RF linearity for $F_t$ and $F_{max}$ with a 2 V forward back-bias is found with varied fin to fin spacing. In some examples, the fin spacing did not shifted the curve significantly, however, the use of forward back bias increased the values, especially in the range from −0.2 to 0.2 V of gate voltage ($V_G$). This benefit was observed with both $F_t$ and $F_{max}$.

With the described strain relaxation technique, ultra-thin body and box FD-SSOI is able to become a common CMOS platform for 5G RF and logic circuits with tensile strained nFETs and compressive strained pFETs co-integrated on the same substrate. Both experiments and simulations show significant logic and RF performance boosts of 20% or higher from strain for both Si nFETs and SiGe pFETs, and the relaxation of strain for SiGe pFETs can be an efficient mean to reduce the $R_{on}$ or to improve device/circuit performance. In addition, comb-like SSOI nFETs and comb-like SiGe pFETs provide a way to further enhance the logic and RF performance by 22% and 36% for $F_t$ and $F_{max}$, respectively.

In one example, the comb-like FET includes a first silicon substrate covered by a $SiO_2$ layer. The $SiO_2$ layer may be effectively planar with a flat contact on the first substrate and a flat top. In some examples, another insulator is used instead of SiO$_2$. On top of the insulator layer is a silicon layer. The silicon layer includes regular regions of a first height separated by regions of a second, smaller height. The silicon layer may be covered with a conformal high-k material or a conformal layer of silicon dioxide. On top of the high-k material or SiO$_2$ conformal layer is the gate metal. The gate metal has a flat upper surface and fills the areas between the regions of the first height over the regions of the second, smaller height. The regions of the first height are the fins. The regions of the second height are the segments connecting the fins. The fins do not extend to the silicon dioxide layer, allowing for better control of the stress level.

Figure 2A:
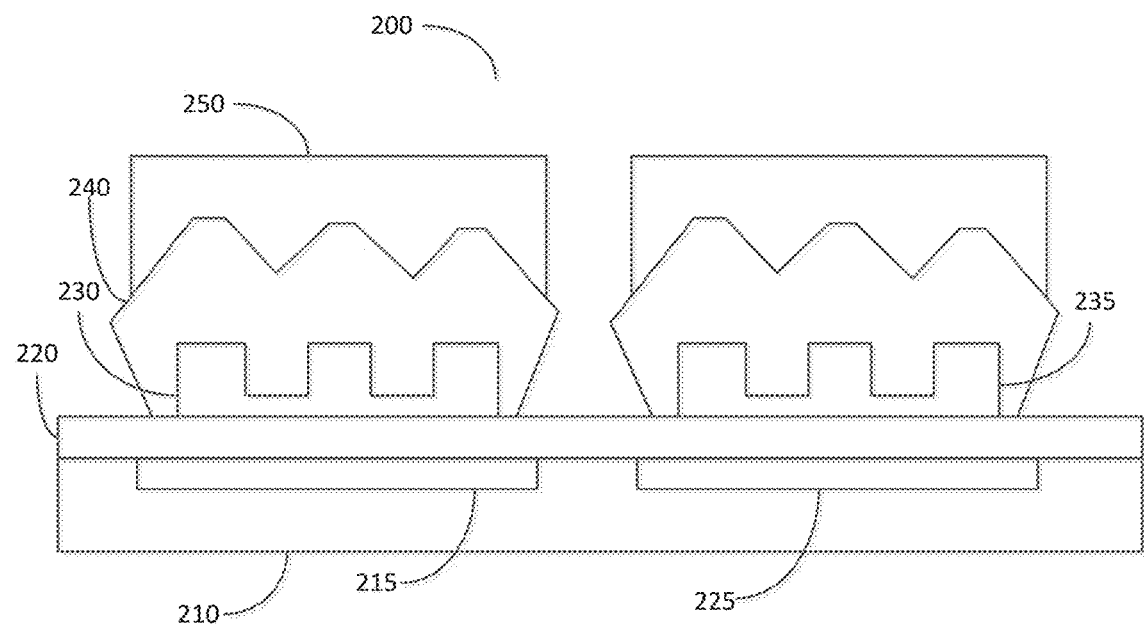
FIG. 2A depicts an example embodiment of a semiconductor structure consistent with this disclosure.

FIG. 2A depicts an example of a semiconductor structure 200 consistent with this disclosure. The semiconductor structure includes two types of regions: tensile strained Si nFET regions 230 and a compressive-strained SiGe pFET regions 235. The two types of regions are produced on a common silicon substrate 210. The regions have a thin layer on the substrate 210 covered with an insulator layer 220, for example, silicon dioxide. The silicon dioxide insulator layer 220 supports a silicon comb structure 230 which has fin regions of a first, larger thickness and connecting regions of a second, thinner thickness. The connecting regions have a spacing which separates the fins and a T$_{comb}$ thickness which defines the thickness of the connecting regions.

The comb regions 230, 235 have gate metal layer 250 on top of the comb regions 230, 235. The gate metal layer 250 may be metal or polysilicon or a combination of polysilicon and metal. The difference between the two instances shown in FIG. 2A is the difference is stress. In an example, the stress of the one comb structure 230 is compressive while the stress on the other comb structure 235 is tensile. These differences in stress allow for optimization of the respective FETs. The semiconductor structure 200 includes back-gate structures 215, 225. Epitaxial source and drain 240 are selectively doped to reduce parasitic resistance.

Figure 2B:
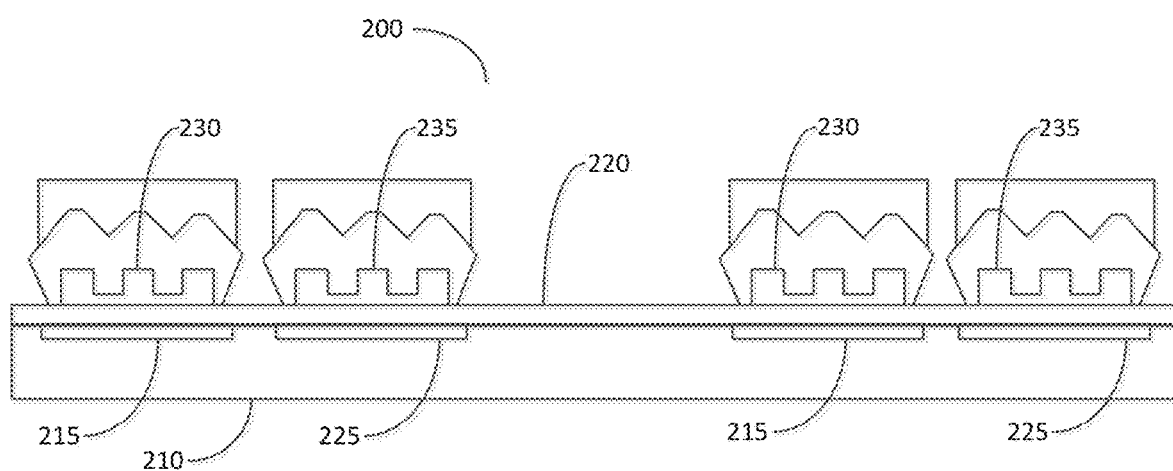
FIG. 2B depicts an example embodiment of a semiconductor structure consistent with this disclosure.

FIG. 2B depicts an example of semiconductor structure 200 consistent with this disclosure. The semiconductor structure 200 includes two types of regions: tensile strained Si nFET regions 230 and a compressive-strained SiGe pFET regions 235. The two types of regions are produced on a common silicon substrate 210. The two types of regions may be used for logic complementary metal-oxide-semiconductor (CMOS) as well as for radio frequency (RF) CMOS. This allows the RF controls to be integrated into the same substrate as the logic.

The substrate 210 supports silicon dioxide insulator layer 220 and the ground-plane or back-gate structures 215, 225 located in the substrate 210 and under the insulator layer 220. The insulator layer 220 supports semiconductor comb structures 230, 235. The semiconductor comb structures 230, 235 are optimized with different strains to support different FETs. For example, the semiconductor comb structure 230 may have a tensile strain and be optimized for nFETs while the semiconductor comb structure 235 may have a compressive strain and be optimized for pFETs. The semiconductor structure 200 may include groups of FETs which provide logic functions and another group of FETs which provide RF functions. The integration of both of these functions on a shared substrate 210 provides advantages not found in previous work. For example, the ability to provide a system on a chip rather than a system on a package for RF devices.

Figure 3:
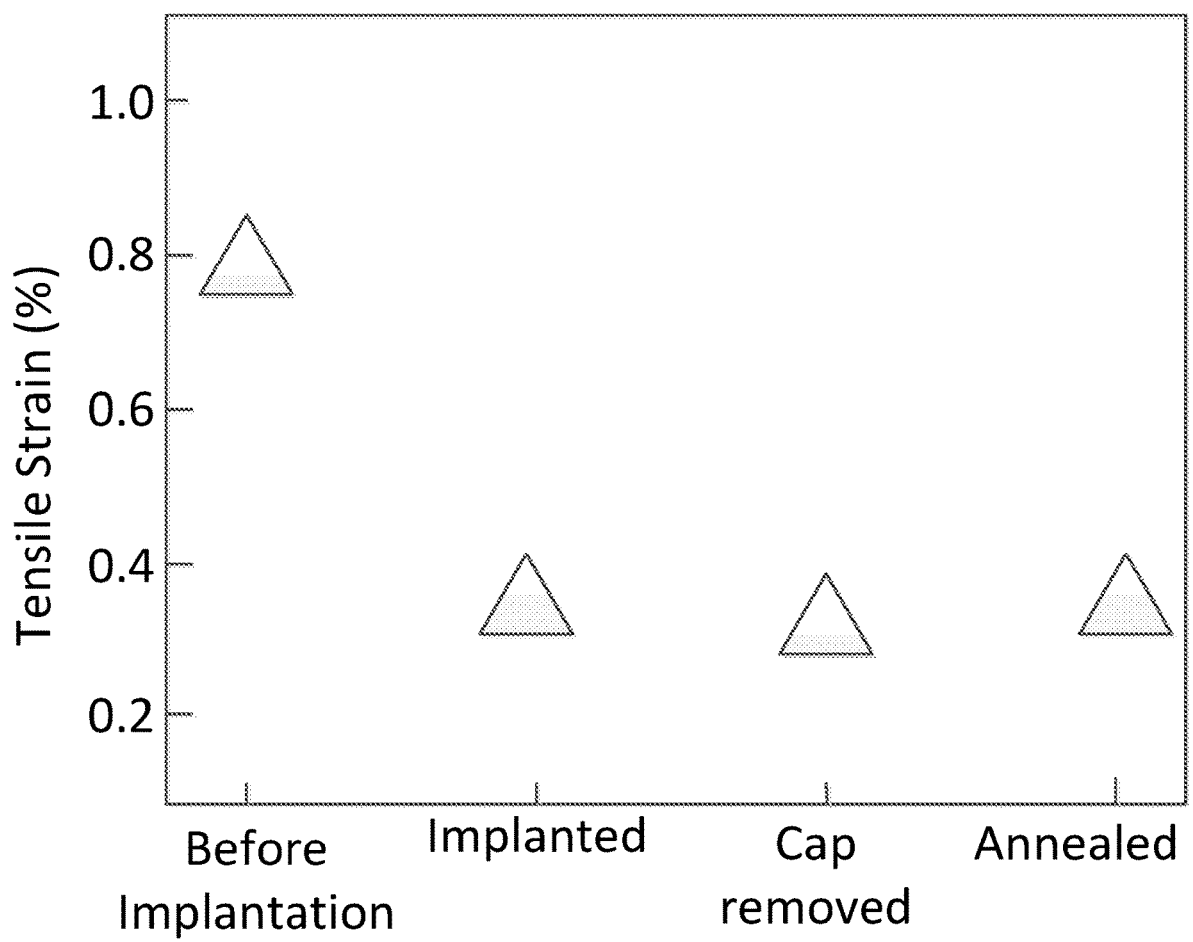
FIG. 3 depicts the tensile strain of the substrate over a number of process steps.

FIG. 3 depicts the tensile strain of the substrate over a number of process steps. The tensile strain before implantation is about 0.8% tensile. Implantation reduces the tensile strain to about 0.4% tensile. The tensile strain then stays reasonably constant for cap removal and annealing. The implanted, cap removed, annealed regions are then subject to SiGe growth which provides a compressive strain. The regions end up with a compressive strain of about −0.8% compressive. This compressive strain improves the performance of the pFETs on the compressive strained regions.

Figure 4:
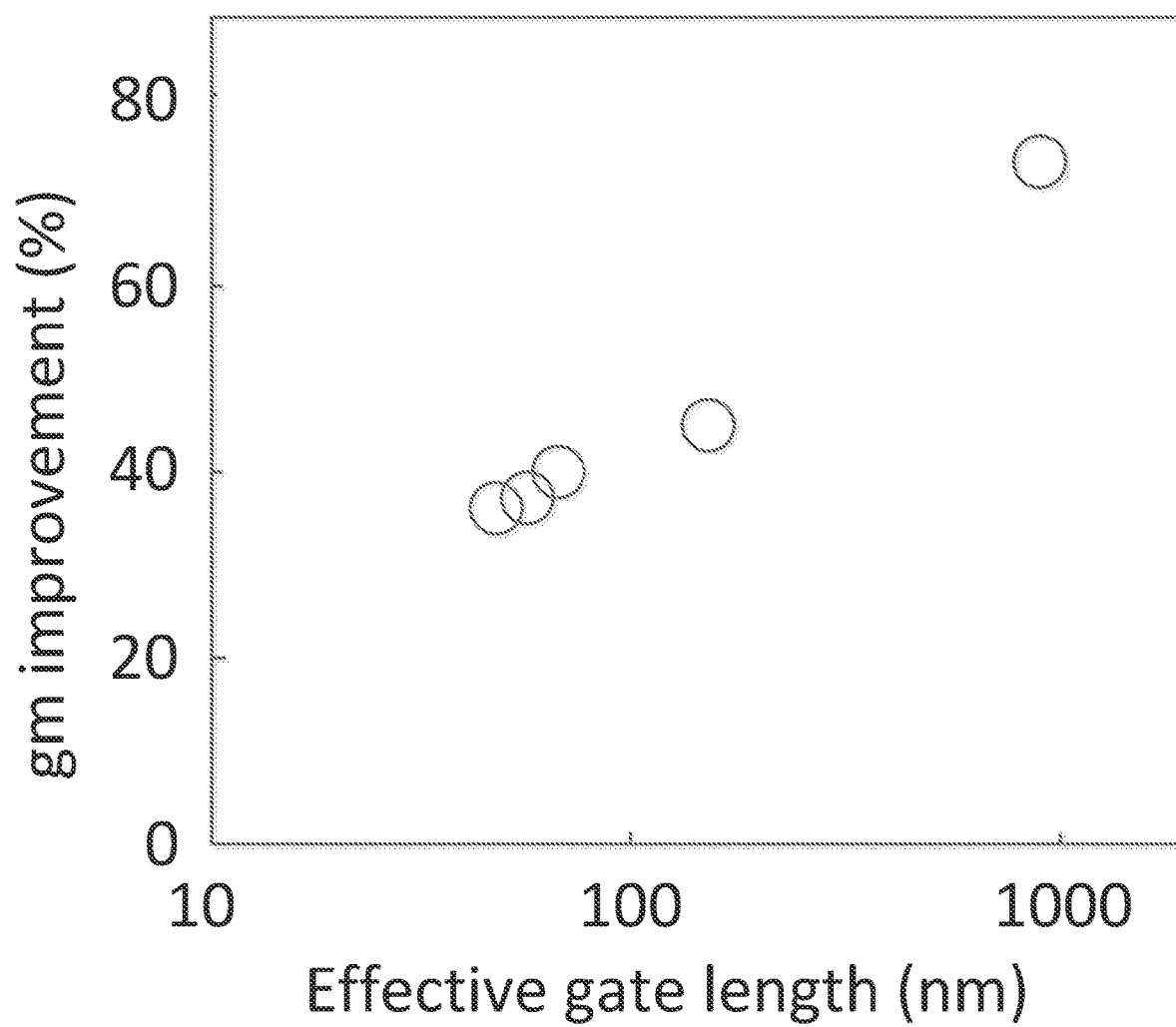
FIG. 4 depicts the $g_m$ improvement as a function of effective gate length in nanometers.

FIG. 4 depicts the g$_m$ improvement as a function of effective gate length in nanometers. The g$_m$ improves over the unstrained controls with the improvement increasing as a function of effective gate length. The g$_m$ was derived at V$_D$ of 1 V.

Figure 5:
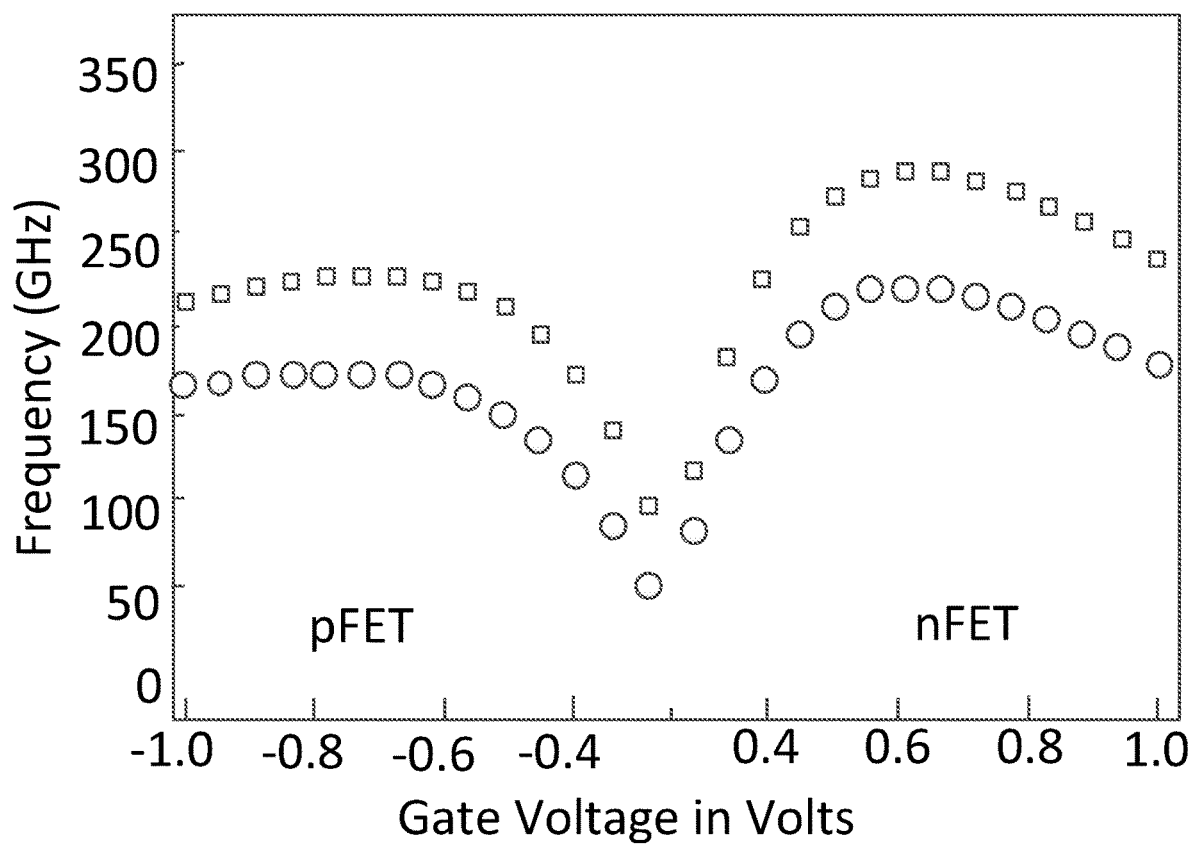
FIG. 5 depicts the $F_t$ versus gate voltage $V_G$ for strained pFETs and nFETs compared with unstrained pFETs and nFETs.

FIG. 5 depicts the F$_t$ versus gate voltage V$_G$ for strained pFETs and nFETs compared with unstrained pFETs and nFETs. The pFET behavior is on the left of the graph while the nFET behavior is on the right of the graph. There is a notable increase in performance as a result of the strain on the FETs. The compressive strain increases the performance of the pFETs while the tensile strain increases the performance of the nFETs. Similar improvement was observed for the F$_{max}$. These values were calculated at V$_D$ of 0.75 V.

Figure 6:
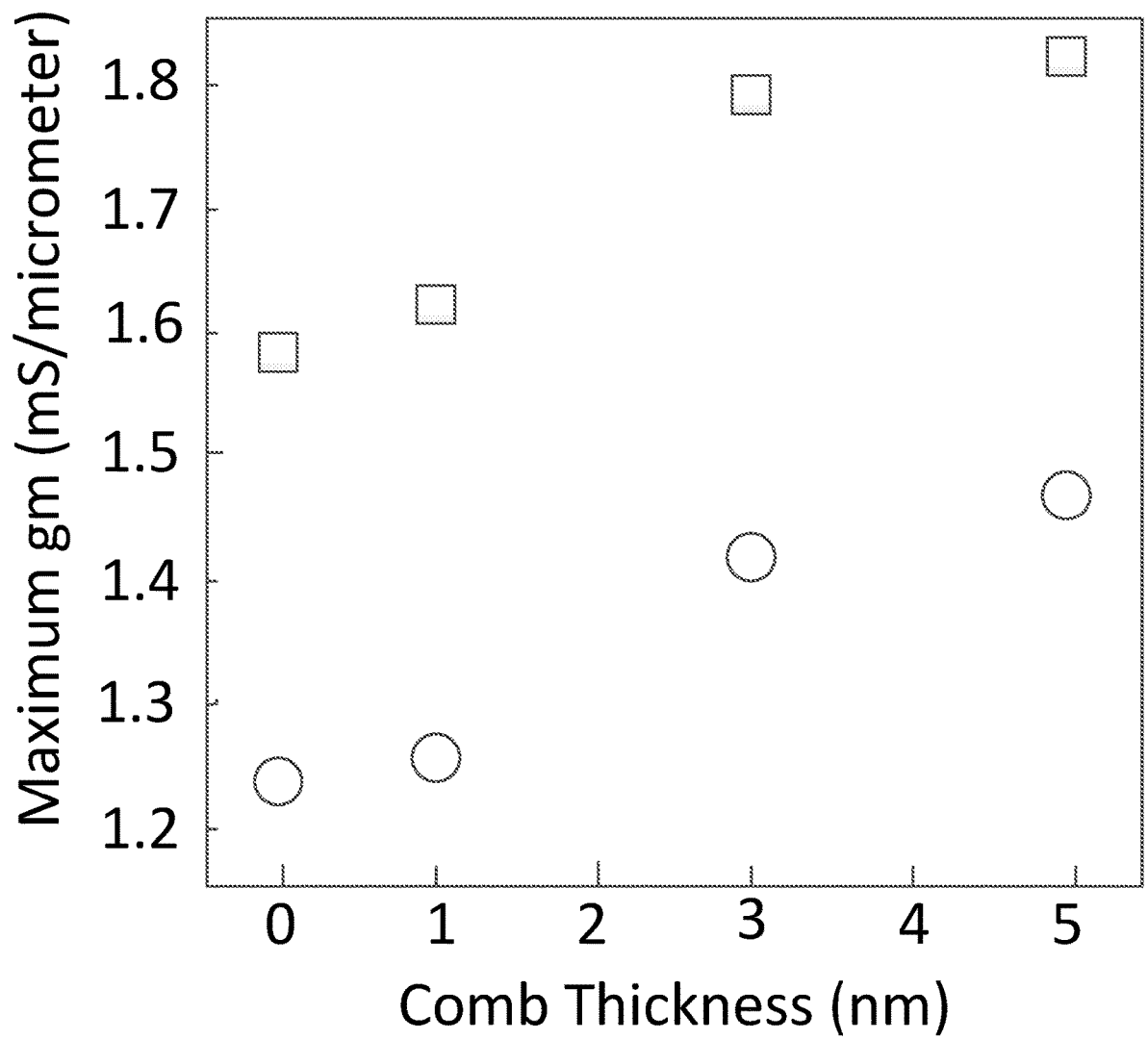
FIG. 6 depicts the peak $g_m$ compared with comb thickness and strain.

FIG. 6 depicts the peak g$_m$ compared with comb thickness and strain. The g$_m$ is valued in mS/μm. As can be seen, the inclusion of strain of 0.8% (squares) measurably increases the g$_m$ compared with the unstrained devices (circles). Larger comb thicknesses have slightly smaller relative increases in gain from the stress but the overall gain is about the same regardless of the comb thickness. There is a trend towards larger g$_m$ with comb thickness. This trend is a 15% gain for stressed substrates and 18.7% gain for unstressed substrates. These values were determined with a spacing of 10 nanometers between fins.

Figure 7:
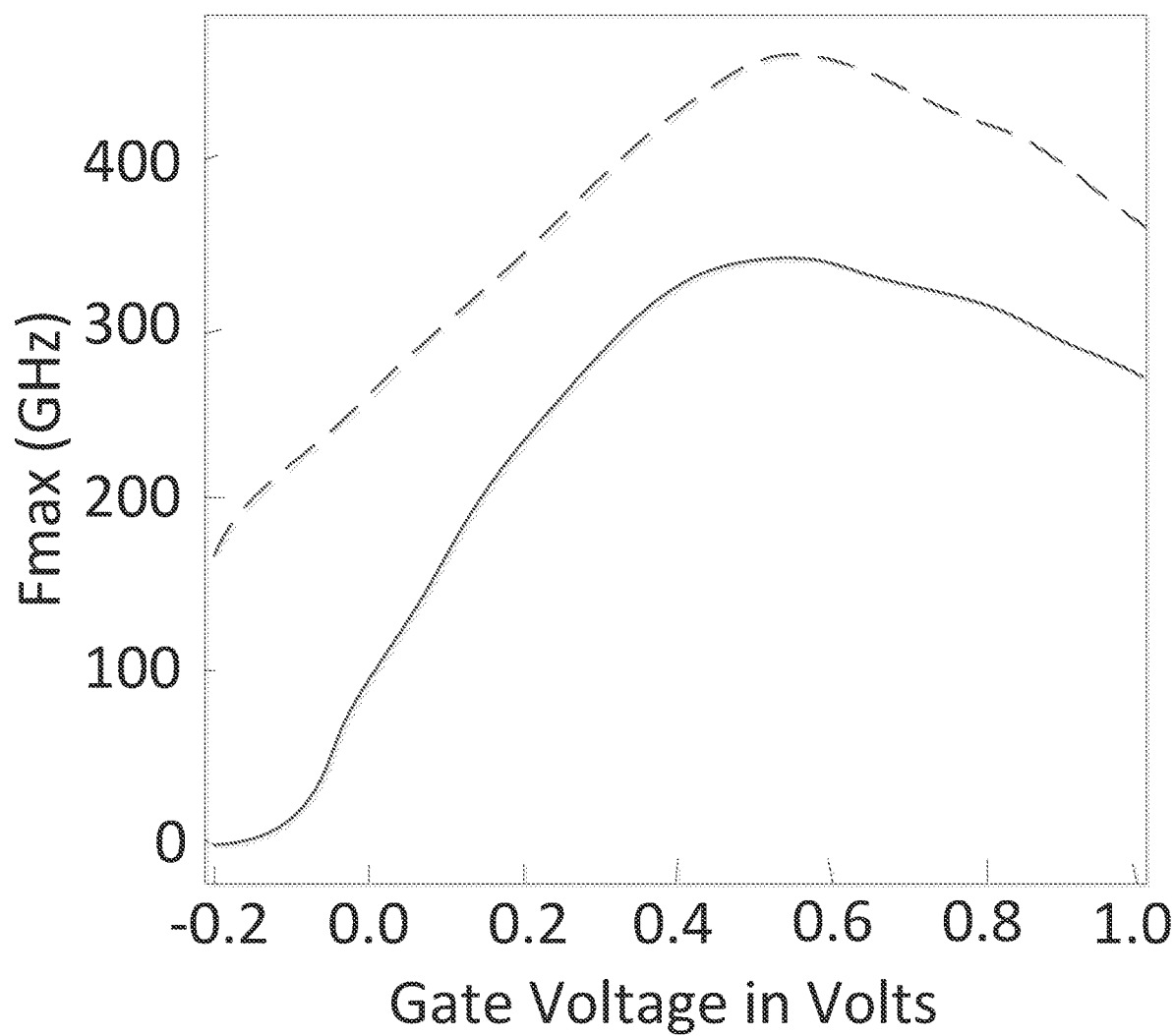
FIG. 7 depicts $F_{max}$ with forward back bias (FBB) for different comb thicknesses.

FIG. 7 depicts F$_{max}$ with forward back bias (FBB) for different comb thicknesses. There is a notable trend with comb thickness with larger comb thicknesses associated with higher F$_{max}$. Similar trends are observed for F$_t$. The values in this figure are produced with a forward back bias of 2 V. The larger comb thicknesses are associated with more flat frequency response, this means the strain comb-devices structure with FBB can produce a high frequency performance at low operation voltage of active power. The strain for these FETs was 0.8%. The forward back bias was associated with a peak F$_{max}$ gain of 36%. This gain was seen in comb thicknesses of 1 nanometer, 3 nanometers, and 5 nanometers. In contrast, the 0 nanometer comb thickness behaved similar to the curve without forward back bias. The 0 nanometers comb thickness are shown with the solid line. The 5 nanometer comb thickness is shown with the dashed line. The 5 nm comb thickness shows an improved performance compared with the 0 nm comb thickness.

Figure 8:
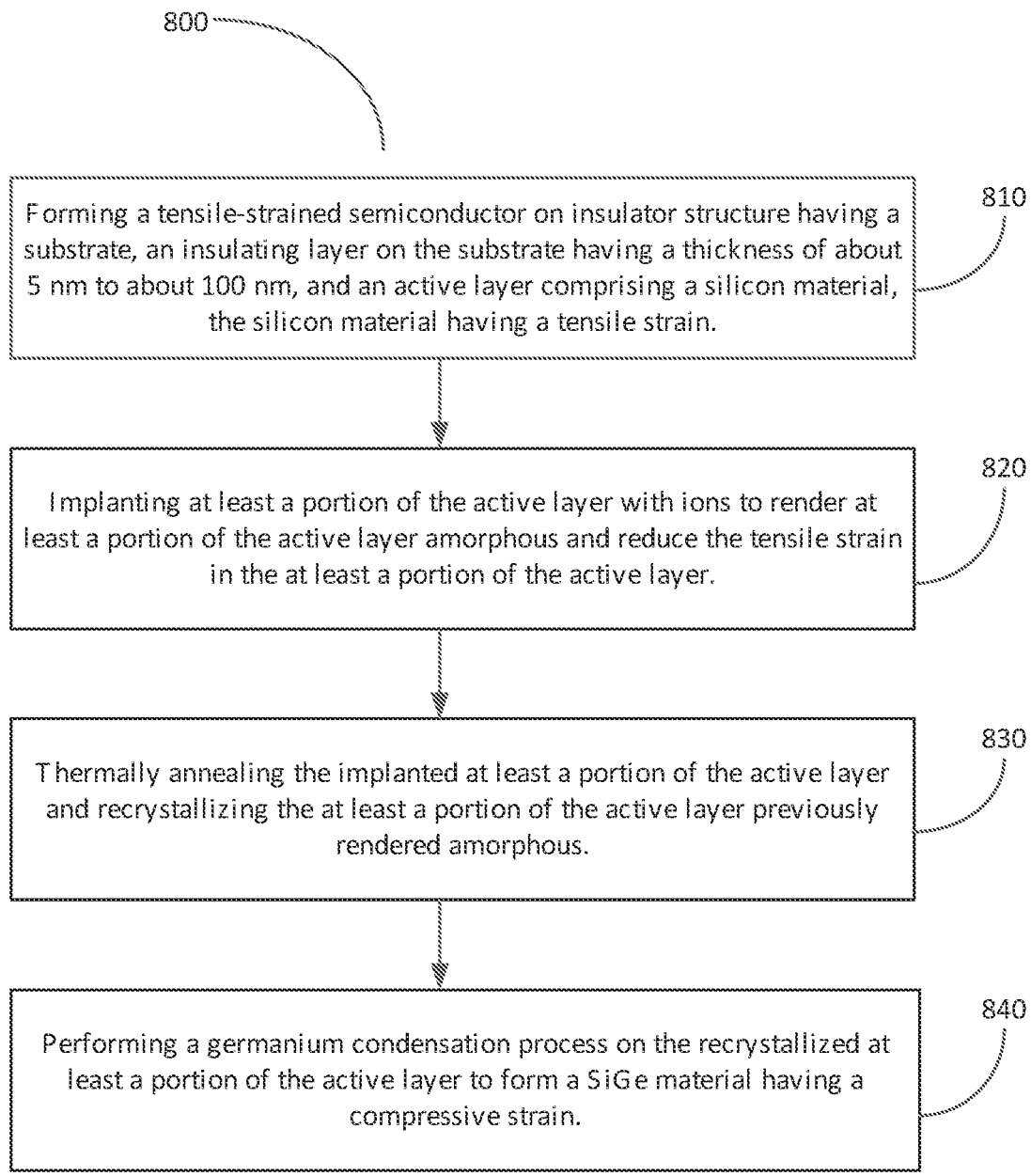
FIG. 8 is a flow diagram for a process consistent with embodiments of this disclosure.

FIG. 8 is a flow diagram for a process 800 consistent with embodiments of this disclosure. The process 800 includes act 810 of forming a fully depleted tensile strained semiconductor-on-insulator structure having a substrate, an insulating layer on the substrate having a thickness of about 5 nm to about 50 nm, and an active layer comprising a fully depleted silicon material, the fully depleted silicon material having a tensile strain.

The process 800 includes act 820 of implanting at least a portion of the active layer with ions to render at least a portion of the active layer amorphous and reduce the tensile strain in the at least a portion of the active layer.

The process 800 includes act 830 of thermally annealing the implanted at least a portion of the active layer and recrystallizing the at least a portion of the active layer previously rendered amorphous.

The process 800 includes act 840 of performing a germanium condensation process on the recrystallized at least a portion of the active layer to form a SiGe material having a compressive strain.

Figure 9:
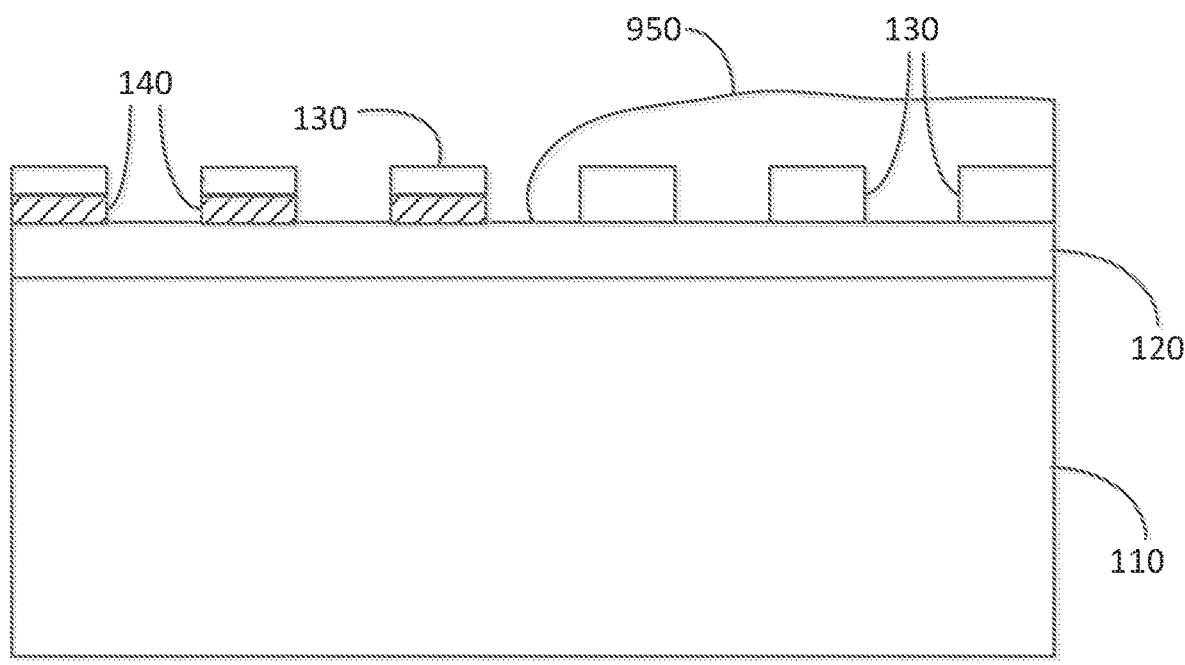
FIG. 9 depicts an example embodiment of a semiconductor structure consistent with this disclosure.

FIG. 9 depicts an example embodiment of a semiconductor structure consistent with this disclosure. FIG. 9 shows a substrate 110 supporting an insulator layer 120. The silicon layer 130 is protected with a mask 950 during ion implantation. The ion implantation thus impacts the exposed silicon material but does not impact the masked silicon. Accordingly the exposed silicon is rendered amorphous 140 by the ion implantation. The strained silicon layer 130 above the amorphous silicon layer 140 must retain crystalline or not rendered amorphous, which is used as a seed to recrystallize the amorphous silicon layer 140 during annealing at low temperature (e.g., 600 to 650° C.) and to grow the selective epitaxial SiGe on the partially strain silicon portion for later Ge condensation.

Although the foregoing descriptions contain many specifics, these are not to be construed as limiting the scope of the disclosure, but merely as providing certain exemplary embodiments. Similarly, other embodiments of the disclosure may be devised that do not depart from the scope of the disclosure. For example, features described herein with reference to one embodiment may also be provided in others of the embodiments described herein. The scope of the embodiments of the disclosure is, therefore, indicated and limited only by the appended claims and their legal equivalents, rather than by the foregoing description. All additions, deletions, and modifications to the disclosure, as disclosed herein, which fall within the meaning and scope of the claims, are encompassed by the disclosure.

What is claimed is:

1. A semiconductor structure, comprising:
a base substrate;
an insulating layer on the base substrate, the insulating layer having a thickness between about 5 nm and about 100 nm; and
an active layer comprising at least two pluralities of different volumes of semiconductor material comprising silicon, germanium, silicon germanium or any combination thereof, the active layer disposed over the insulating layer, the at least two pluralities of different volumes of semiconductor material comprising:
a first plurality of volumes of semiconductor material having a tensile strain of at least 0.6%; and
a second plurality of volumes of semiconductor material having a compressive strain of at least −0.6%, the second plurality of volumes of semiconductor material comprising a compressive strained silicon germanium material positioned on recrystallized silicon obtained from crystallization of ion-implanted amorphous silicon.

2. The semiconductor structure of claim 1, further comprising:
a plurality of nFETs, each nFET comprising a channel region including a volume of the tensile strained semiconductor material of the first plurality and a plurality of pFETs, each pFET comprising a channel region including a volume of the compressive strained semiconductor material of the second plurality.

3. The semiconductor structure of claim 1, wherein the tensile strain is about 0.8% and the compressive strain is about −0.8%.

4. The semiconductor structure of claim 1, wherein each volume of semiconductor material of the at least two pluralities has a comb structure.

5. A semiconductor device, comprising:
a semiconductor-on-insulator substrate including a base substrate, a buried insulator layer, and an active layer comprising a fully depleted semiconductor material; and
a plurality of transistors in a common plane, each transistor of the plurality of transistors comprising a channel region in a volume of the fully depleted semiconductor material of the active layer of the semiconductor-on-insulator substrate, wherein plurality of transistors comprises:
nFETs having tensile strained channel regions; and
pFETs having compressive strained channel regions, wherein the compressive strained channel regions comprise a compressive strained silicon germanium material positioned on recrystallized silicon obtained from crystallization of ion-implanted amorphous silicon.

6. The semiconductor device of claim 5, wherein the channel regions of the transistors of the plurality of transistors are located within a volume of the fully depleted semiconductor material having a comb structure including a horizontally extending spine and vertically extending tines extending perpendicularly from the spine, the tines having a first thickness of between about 10 nanometers and about 30 nanometers, the spine having a second thickness between about 0 nanometers and about 10 nanometers.

7. The semiconductor device of claim 6, wherein adjacent tines of the comb structure are separated from one another in a direction parallel to the spine of the comb structure by a distance between about 5 nanometers and about 15 nanometers.

8. The semiconductor device of claim 5, wherein the tensile strained channel regions of the nFETs comprise tensile strained silicon, and the compressive strained channel regions of the pFETs comprise the compressive strained silicon germanium.

9. The semiconductor device of claim 5, further comprising back gates under each transistor of the plurality of transistors.

10. The semiconductor device of claim 9, wherein the back gates comprise local phosphorus or arsenic or boron implanted under a buried oxide.

11. The semiconductor device of claim 9, further comprising a comb structure configured to provide back-gate coupling.

12. The semiconductor device of claim 5, wherein a dosage of the implanted ions in the compressive strained channel regions is between about $1\times10^{14}$ ions/cm$^2$ and about $4\times10^{14}$ ions/cm$^2$.

13. The semiconductor structure of claim 1, wherein a dosage of the implanted ions in the second plurality of volumes of semiconductor material is between about $1\times10^{14}$ ions/cm$^2$ and about $4\times10^{14}$ ions/cm$^2$.

* * * * *